United States Patent
Tada et al.

(10) Patent No.: US 6,921,627 B2
(45) Date of Patent: Jul. 26, 2005

(54) ORGANIC ELECTROLUMINESCENT DEVICE WITH SELF-ALIGNED INSULATING FILLERS AND METHOD FOR MANUFACTURING THE SAME

(75) Inventors: Hiroshi Tada, Tokyo (JP); Atsushi Oda, Tokyo (JP); Hitoshi Ishikawa, Tokyo (JP); Satoru Toguchi, Tokyo (JP)

(73) Assignee: Samsung SDI Co., Ltd., Suwon (KR)

( * ) Notice: Subject to any disclaimer, the term of this patent is extended or adjusted under 35 U.S.C. 154(b) by 82 days.

(21) Appl. No.: 10/697,050

(22) Filed: Oct. 31, 2003

(65) Prior Publication Data

US 2004/0091819 A1 May 13, 2004

Related U.S. Application Data

(62) Division of application No. 10/075,761, filed on Feb. 15, 2002, now abandoned.

(30) Foreign Application Priority Data

Feb. 15, 2001 (JP) ........................................ 2001-038808

(51) Int. Cl.⁷ ............................... H01J 1/62; H01J 9/20
(52) U.S. Cl. ....................... 430/314; 430/319; 430/321; 313/504
(58) Field of Search ................................ 430/314, 319, 430/321; 313/504

(56) References Cited

U.S. PATENT DOCUMENTS

| | | | |
|---|---|---|---|
| 4,769,292 A | | 9/1988 | Tang et al. |
| 6,106,352 A | * | 8/2000 | Fujii ............................ 445/24 |
| 6,197,704 B1 | | 3/2001 | Endo et al. |
| 6,639,358 B2 | * | 10/2003 | Ishikawa et al. ............ 313/504 |
| 2001/0001050 A1 | | 5/2001 | Miyashita et al. |

FOREIGN PATENT DOCUMENTS

| | | |
|---|---|---|
| JP | 63-264692 A | 11/1988 |
| JP | 02-247278 A | 10/1990 |
| JP | 03-250583 A | 11/1991 |
| JP | 03-274694 A | 12/1991 |
| JP | 05-17765 A | 1/1993 |
| JP | 05-70773 A | 3/1993 |
| JP | 08-298186 A | 11/1996 |
| JP | 09-157643 A | 6/1997 |
| JP | 09-268283 A | 10/1997 |
| JP | 09-268284 A | 10/1997 |
| JP | 2734464 B2 | 1/1998 |
| JP | 10-72581 A | 3/1998 |
| JP | 2911552 B2 | 4/1999 |
| JP | 2000-123978 | 4/2000 |
| JP | 2000-252078 A * | 9/2000 |

OTHER PUBLICATIONS

C. W. Tang et al., "Organic electroluminescent diodes", *Appl. Phys. Lett.*, vol. 51, No. 12, Sep. 21, 1987, pp. 913–915.

* cited by examiner

Primary Examiner—John A. McPherson
(74) Attorney, Agent, or Firm—McGuireWoods LLP

(57) ABSTRACT

In an organic electroluminescent device, a plurality of striped lower electrodes are formed on an insulating substrate along a first direction, and a plurality of fillers made of amorphous carbon are filled between the lower electrodes. Organic thin film layers including an emitting layer is formed on the fillers and the lower electrodes. A plurality of striped upper electrodes are formed on the organic thin film layer along a second direction different from the first direction.

14 Claims, 19 Drawing Sheets

ORGANIC ELECTROLUMINESCENT DEVICE WITH SELF-ALIGNED INSULATING FILLERS AND METHOD FOR MANUFACTURING THE SAME

This is a divisional of application Ser. No. 10/075,761 filed Feb. 15, 2002, now abandoned; the disclosure of which is incorporated herein by reference.

BACKGROUND OF THE INVENTION

1. Field of the Invention

The present invention relates to an organic electroluminescent device and its manufacturing method.

2. Description of the Related Art

An organic electroluminescent device is a light-emitting device which makes use of a principle that when an electric field is applied to the device, a fluoresent material emits light in response to a charge recombination of holes injected from an anode and electrons from a cathode. Such organic electroluminescent devices have been developed ever since C. W. Tang et al. published "Organic Electroluminescent Diodes", Applied Physics Lett. 51(12), pp. 913–915, Sep. 21, 1987.

Tang et al. reported an electroluminecent device of a stacked structure using tris (8-quinolinol aluminum) in an emitting layer and a triphenyldiamine derivative in a hole-transporting layer. This stacked structure has advantages in that the injection efficiency of holes into the emitting layer can be improved, that electrons injected from a cathode can be blocked to increase the efficiency of exciton production from charge recombination, and that the excitons into the emitting layer can be confined. A multi-layered structure such as a double layered structure composed of a hole-injecting and transporting layer and an electron-transporting and emitting layer or a triple layered structure composed of a hole-injecting and transporting layer, an emitting layer and an electron-injecting and transporting layer is well known as an organic electroluminescent device. In order to increase the recombination efficiency of injected holes and electrons, various improvements have been introduced into the structure and fabrication process of the multi-layered structure.

A first prior art organic electroluminescent device is constructed by a transparent insulating substrate, striped lower electrodes made of indium tin oxide (ITO) formed on the transparent insulating substrate, an emitting layer formed on the lower electrodes, and striped upper electrodes formed on the emitting layer. In this case, the upper electrodes are arranged along a first direction, and the lower electrodes are arranged along a second direction normal to the first direction. As occasion demands, a hole-transporting layer is interposed between the lower electrodes and the emitting layer, and an electron-transporting layer is interposed between the emitting layer and the upper electrodes, to enhance the injection efficiency of carriers such as holes and electrons into the emitting layer. Note that the emitting layer, the hole-transporting layer and the electron-transporting layer are made of organic materials.

In the above-described first prior art organic electroluminescent device, however, since there are steps at the edges of the lower electrodes, the portions of the organic layers such as the hole-transporting layer, the emitting layer and the electron-transporting layer in proximity to the steps of the lower electrodes become thinner. Particularly, since the emitting layer is very thin, i.e., about 100 nm thick, when the portions of the emitting layer in proximity to the steps of the lower electrodes become thinner, a short-circuit would occur between the lower electrodes and the upper electrodes through the thinner portions of the emitting layer to damage the organic electroluminescent device.

A second prior art organic electroluminescent device includes an insulating pattern layer having elements filled between the lower electrodes to substantially make the edges of the lower electrodes smooth, thus avoiding a short-circuit between the lower electrodes and the upper electrodes through the organic layers including the emitting layer (see: JP-A-3-250583, JP-A-3-274694 & JP-A-4-51494).

In the above-described second prior art organic electroluminescent device, however, since a photolithography and etching process is required to form the insulating pattern layer, the manufacturing cost is increased.

In a third prior art organic electroluminescent device, the insulating layer filled between the lower electrodes is formed by the same photoresist pattern layer for forming the lower electrodes, to thereby decrease the manufacturing cost (see: FIG. 6 of JP-A-2000-123978). That is, first, an ITO layer is deposited on a transparent insulating substrate. Then, a photoresist pattern layer is formed on the ITO layer by a photolithography process, and the ITO layer is patterned by an etching process using the photoresist pattern layer as a mask to form lower electrodes. Then, an insulating layer is deposited on the entire surface without removing the photoresist pattern layer, and a so-called lift-off operation is performed on the photoresist pattern layer, so that the photoresist pattern layer and a part of the insulating layer on the photoresist pattern layer are simultaneously removed. As a result, the remainder of the insulating layer is filled as fillers between the lower electrodes.

In the above-described third prior art organic electroluminescent device, however, since the formation of the lower electrodes by an etching process is carried out in a chamber different from a chamber where the formation of the insulating layer is carried out, the manufacturing cost is still high.

SUMMARY OF THE INVENTION

It is an object of the present invention to provide an organic electroluminescent device and its manufacturing method suppressing short-circuits without increasing the manufacturing cost.

According to the present invention, in an organic electroluminescent device, a plurality of striped lower electrodes are formed on an insulating substrate along a first direction, and a plurality of fillers made of amorphous carbon are filled between the lower electrodes. At least one organic thin film layer including an emitting layer is formed on the fillers and the lower electrodes. A plurality of striped upper electrodes are formed on the organic thin film layer along a second direction different from the first direction.

Also, in a method for manufacturing an organic electroluminescent device according to the present invention, a conductive layer is formed along a first direction on an insulating substrate. Then, a photoresist pattern layer having a plurality of striped elements is formed along a first direction on the conductive layer. Then, the conductive layer is etched by a dry etching process using a first plasma gas and using the photoresist pattern layer as an etching mask in a chamber to form striped lower electrodes. Then, an insulating layer is deposited on the photoresist pattern layer and on the insulating substrate between the lower electrodes by a plasma deposition process using a second plasma gas in the above-mentioned chamber. Then, a lift-off operation is performed upon the photoresist pattern layer to remove the photoresist pattern layer and a part of the insulating layer on the photoresist pattern layer. Then, at least one organic thin film layer including an emitting layer is formed on the insulating layer and the lower electrodes. Finally, a plurality of striped upper electrodes are formed on the organic thin film layer along a second direction different from the first direction.

BRIEF DESCRIPTION OF THE DRAWINGS

The present invention will be more clearly understood from the description set forth below, with reference to the accompanying drawings, wherein.

DESCRIPTION OF THE PREFERRED EMBODIMENTS

A first embodiment of the method for manufacturing an organic electroluminescent device according to the present invention will now be explained with reference to FIGS. 1A, 1B, 1C, 1D and 1E.

Figure 1A:
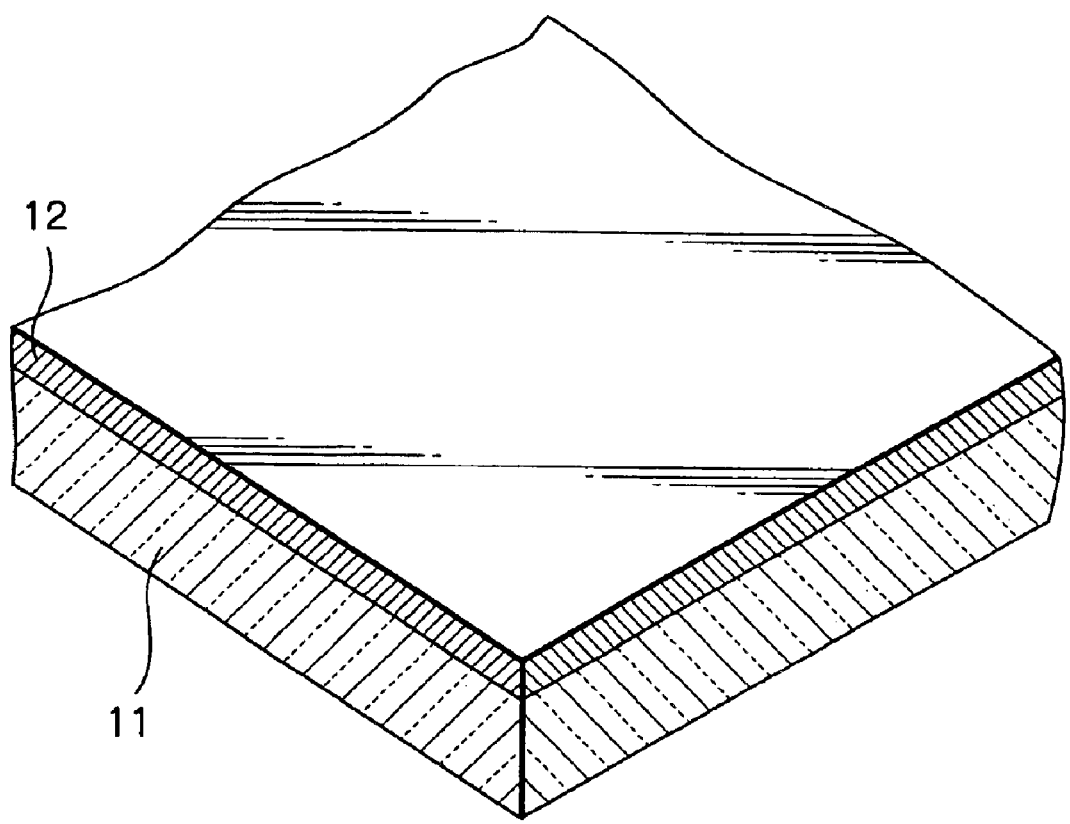
FIGS. 1A, 1B, 1C, 1D and 1E are perspective views for explaining a first embodiment of the method for manufacturing an organic electroluminescent device according to the present invention.

First, referring to FIG. 1A, an about 80 nm thick ITO layer 12 is deposited on a transparent insulating substrate 11 made of glass by a sputtering process.

Figure 1B:
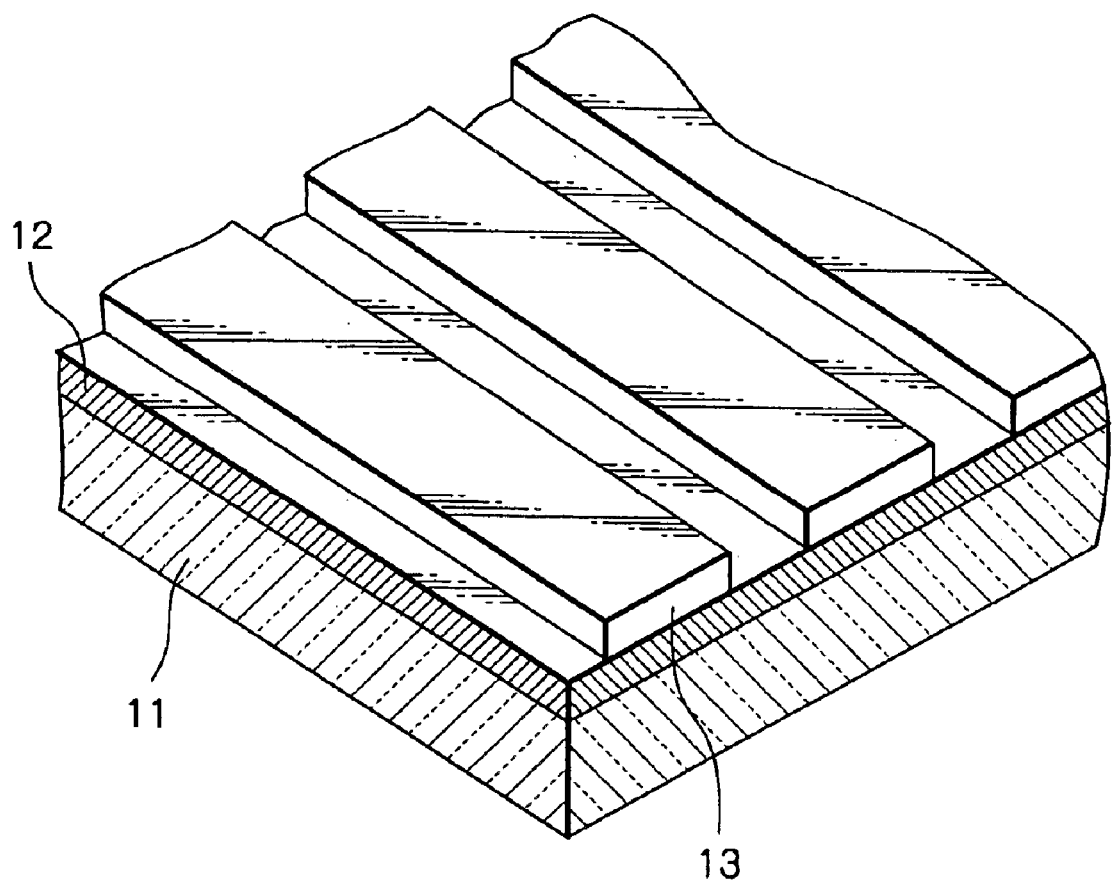

Next, referring to FIG. 1B, a photoresist layer is coated on the ITO layer 12 by a spin-coating process. Then, the photoresist layer is patterned by a photolithography and developing process to form a photoresist pattern layer 13 having striped elements along a predetermined direction.

Figure 1C:
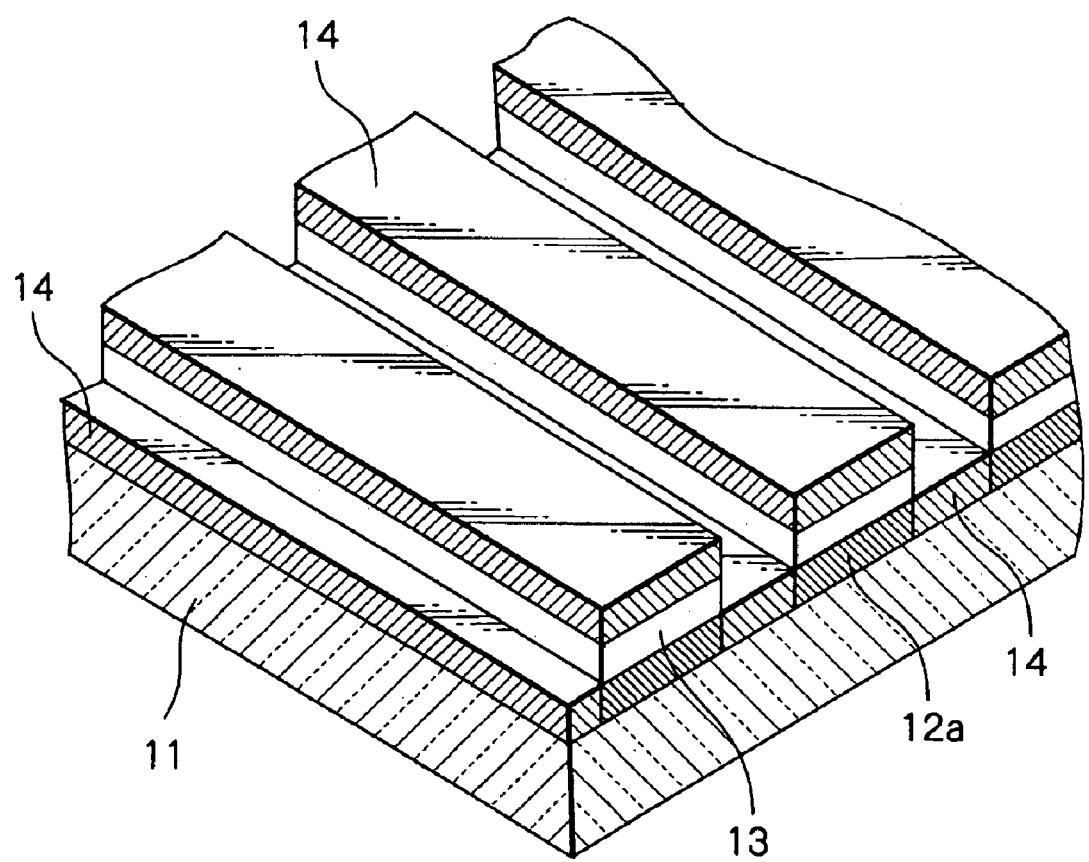

Next, referring to FIG. 1C, the transparent insulating substrate 11 is put in a reactive ion etching (RIE) chamber, and the ITO layer 12 is etched by an RIE process using $CH_4/H_4$ mixture gas, to form lower electrodes 12a. In this case, plasma generating conditions such as the pressure, the flow rate and the ratio of gas mixture are changed, so that an about 80 nm thick amorphous carbon layer 14 is deposited simultaneously with the etching of the ITO layer 12.

Figure 1D:
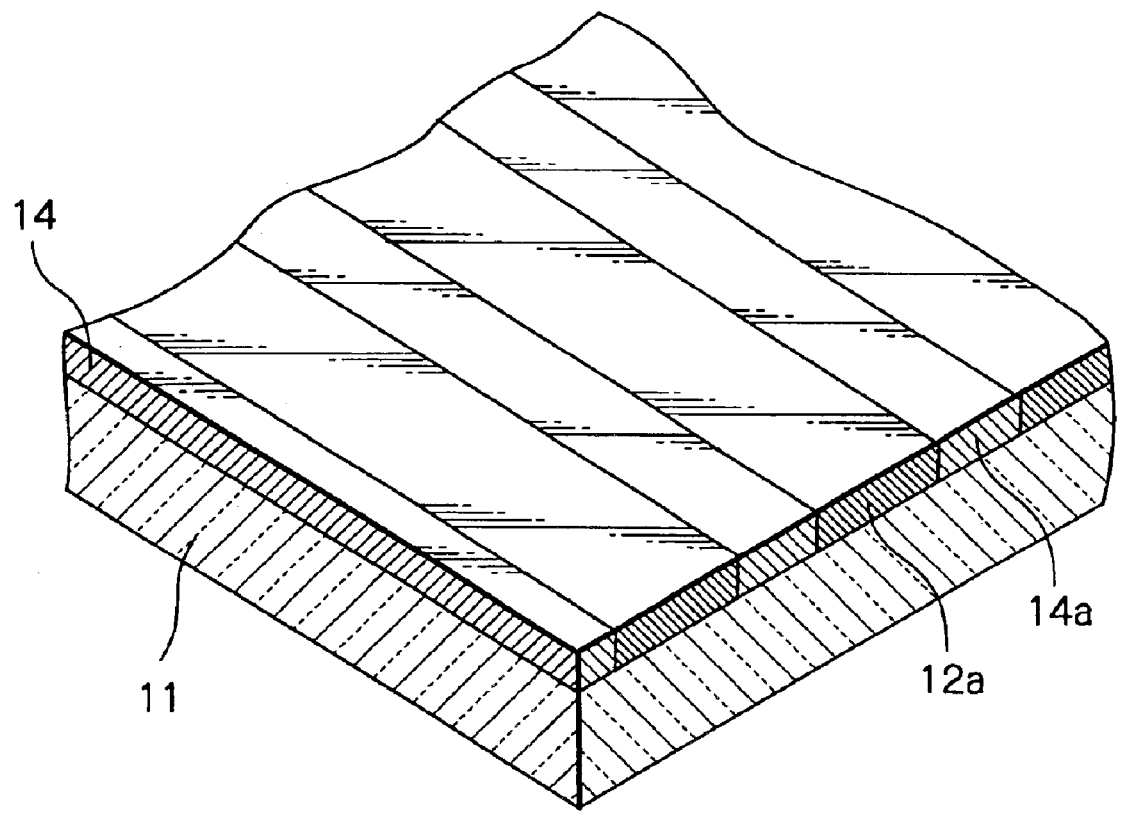

Next, referring to FIG. 1D, a so-called lift-off operation is performed upon the photoresist pattern layer 13, so that the photoresist pattern layer 13 and a part of the amorphous carbon layer 14 thereon are simultaneously removed. As a result, amorphous carbon fillers 14a are filled between the lower electrodes 12a. In this case, as occasion demands, a flattening process such as a chemical mechanical polishing (CMP) process is performed upon the amorphous carbon fillers 14a. Note that the amorphous carbon fillers 14a are 5 nm to 1 $\mu$m thick, preferably, 20 to 300 nm thick.

Figure 1E:
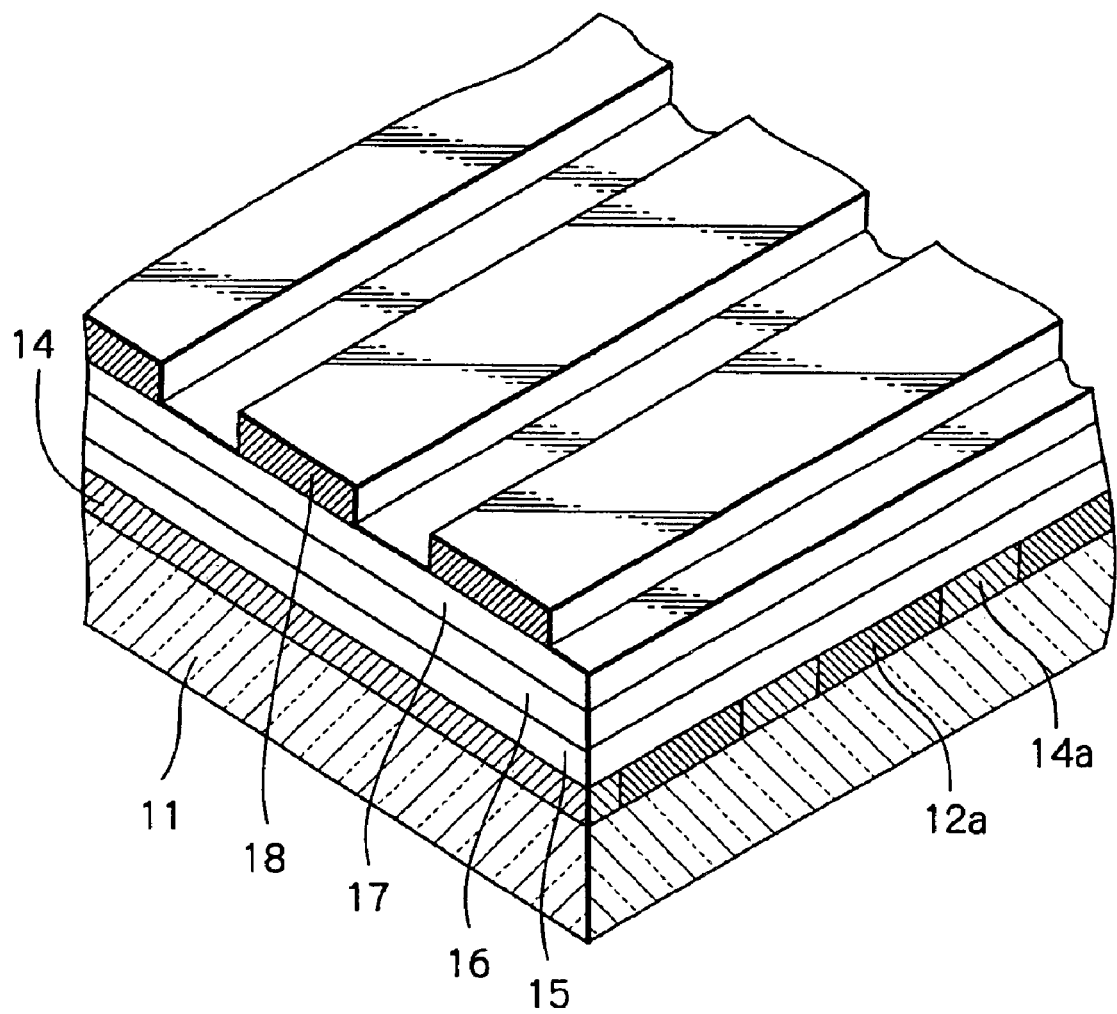

Finally, referring to FIG. 1E, an about 50 nm thick hole-transporting layer 5, an about 70 nm thick emitting layer 16 and an about 20 nm thick electron-transporting layer 17 are sequentially deposited by a vacuum evaporation process. Then, a plurality of about 150 nm thick striped upper electrodes 18 made of Mg—Ag alloy are formed by a vacuum co-evaporation process. In this case, the upper electrodes 18 are normal to the lower electrodes formed by the ITO layer 14. Then, the upper electrodes 18 are sealed by resin, to complete the organic electroluminescent element.

According to the inventors' experiment, the organic electroluminescent device of FIG. 1E was driven to show an excellent diode characteristic having a rectification ratio of more than $10^4$.

Thus, in the first embodiment, since the lower electrodes 12a and the amorphous carbon fillers 14a filled between the lower electrodes 12a are formed by the same RIE chamber, the manufacturing cost can be decreased.

A second embodiment of the method for manufacturing an organic electroluminescent device according to the present invention will be explained next with reference to FIGS. 2A, 2B, 2C, 2D, 2E and 2F.

Figure 2A:
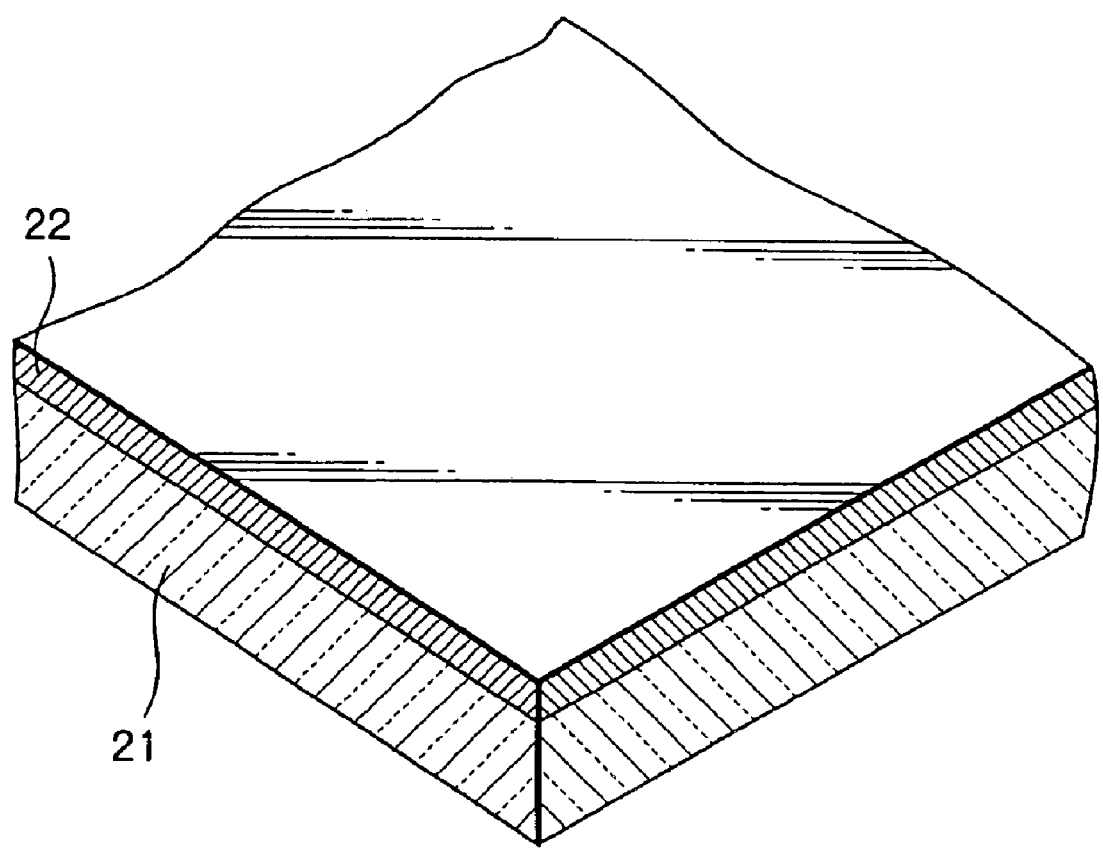
FIGS. 2A, 2B, 2C, 2D, 2E and 2F are perspective views for explaining a second embodiment of the method for manufacturing an organic electroluminescent device according to the present invention.

First, referring to FIG. 2A, an about 80 nm thick ITO layer 22 is deposited on a transparent insulating substrate 21 made of glass by a sputtering process.

Figure 2B:
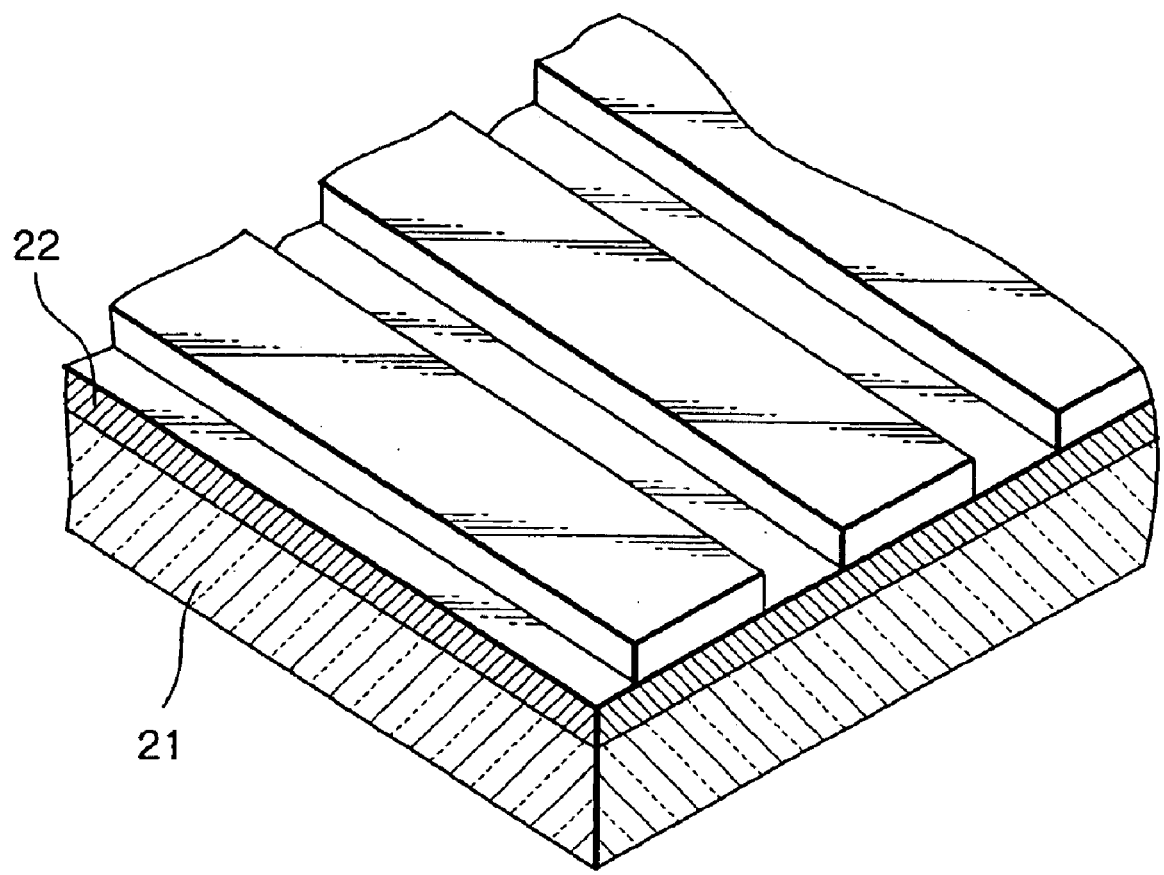

Next, referring to FIG. 2B, a photoresist layer is coated on the ITO layer 22 by a spin-coating process. Then, the photoresist layer is patterned by a photolithography and developing process to form a photoresist pattern layer 23 having striped elements along a predetermined direction.

Figure 2C:
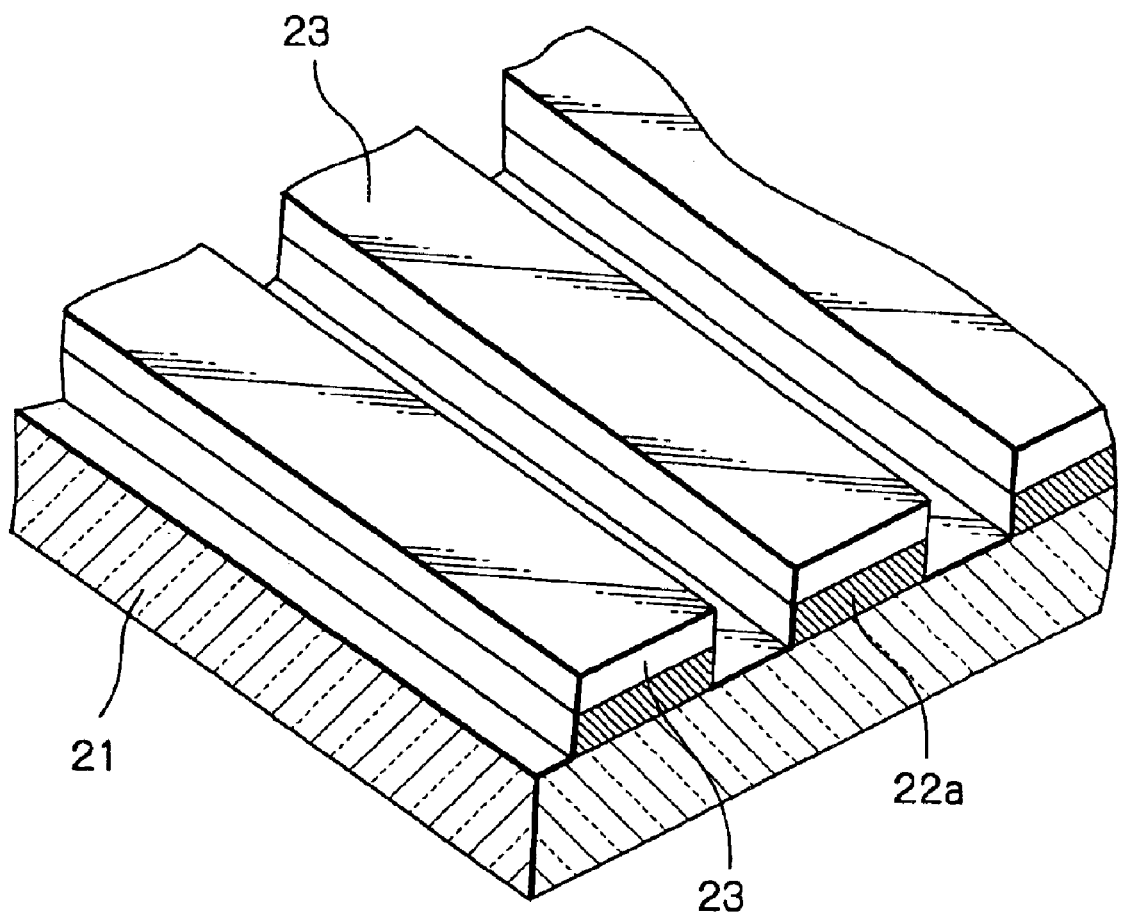

Next, referring to FIG. 2C, the transparent insulating substrate 21 is put in an RIE chamber, and the ITO layer 12 is etched by an RIE process using HI/Ar mixture gas, to form lower electrodes 22a.

Figure 2D:
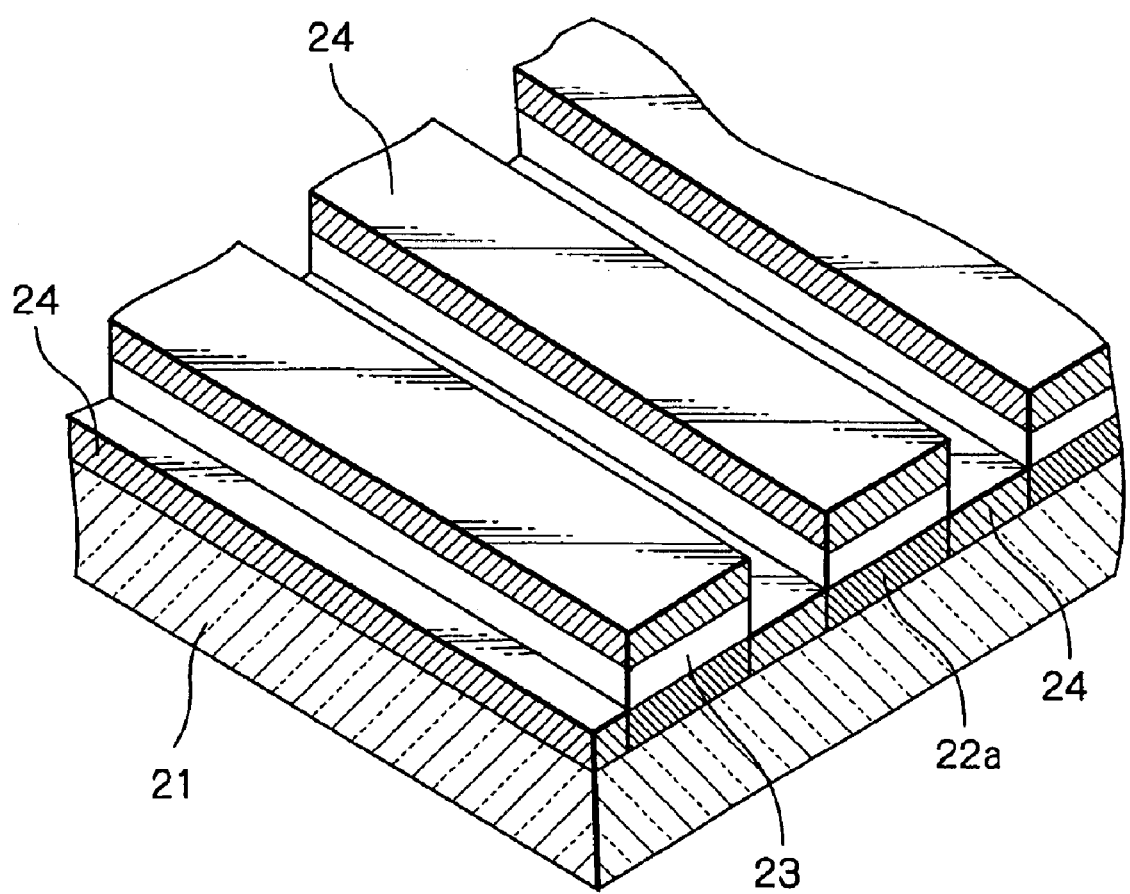

Next, referring to FIG. 2D, an about 80 nm thick amorphous carbon layer 24 is deposited by a reactive ion process using $CH_4/H_4$ mixture gas in the same RIE chamber as in the step as illustrated in FIG. 2C.

Figure 2E:
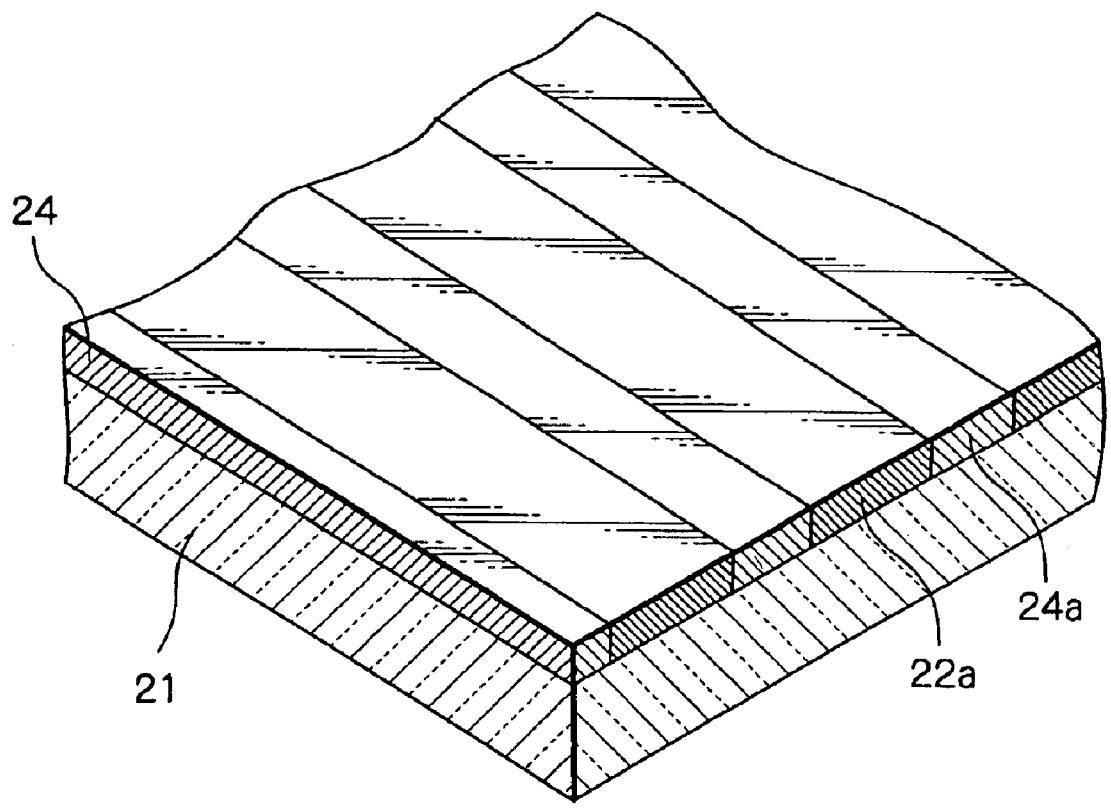

Next, referring to FIG. 2E, a so-called lift-off operation is performed upon the photoresist pattern layer 23, so that the photoresist pattern layer 23 and a part of the amorphous carbon layer 24 thereon are simultaneously removed. As a result, amorphous carbon fillers 24a are filled between the lower electrodes 22a. In this case, as occasion demands, a flattening process such as a CMP process is performed upon the amorphous carbon fillers 24a. Note that the amorphous carbon fillers 24a are 5 nm to 1 $\mu$m thick, preferably, 20 to 300 nm thick.

Figure 2F:
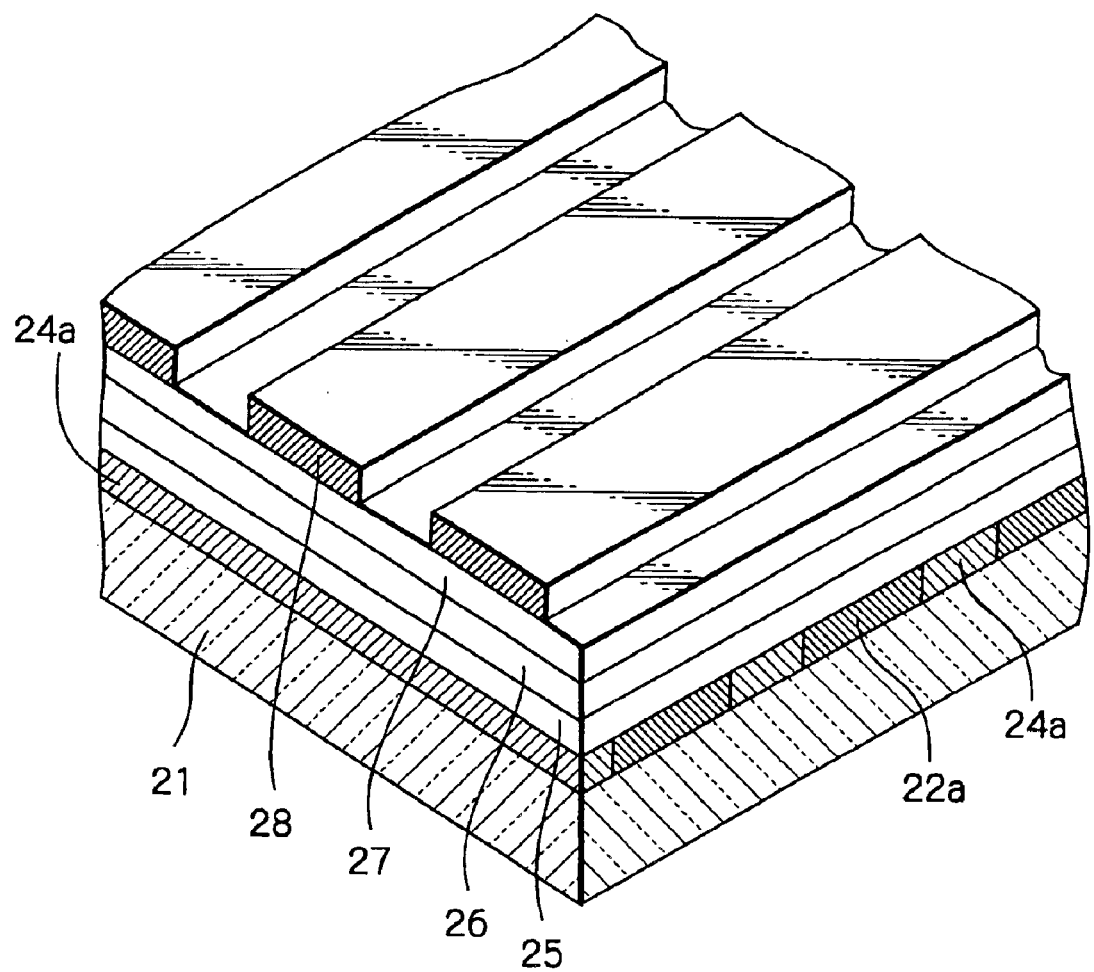

Finally, referring to FIG. 2F, an about 50 nm thick hole-transporting layer 25, an about 70 nm thick emitting layer 26 and an about 20 nm thick electron-transporting layer 27 are sequentially deposited by a vacuum evaporation process. Then, a plurality of about 150 nm thick striped upper electrodes 28 made of Mg—Ag alloy are formed by a vacuum evaporation process. In this case, the upper electrodes 28 are normal to the lower electrodes formed by the ITO layer 24. Then, the upper electrodes 28 are sealed by resin, to complete the organic electroluminescent element.

According to the inventors' experiment, the organic electroluminescent device of FIG. 2F was driven to show an excellent diode characteristic having a rectification ratio of more than $10^4$.

Even in the second embodiment, since the lower electrodes 22a and the amorphous carbon fillers 24a filled between the lower electrodes 22a are formed by the same RIE chamber, the manufacturing cost can be decreased.

In the above-described second embodiment, although the fillers 24a is made of amorphous carbon, the fillers 24a can be made of other material such as silicon oxide or silicon nitride.

In the above-described embodiments, the hole-transporting layer 15(25), the emitting layer 16(26) and the electron-transporting layer 17(27) are sandwiched by the lower electrodes 12(22) and the upper electrodes 18(28). However, the hole-transporting layer 15(25) and/or the electron-transporting layer 17(27) can be omitted.

Also, the lower electrodes are made of ITO. However, the lower electrodes can be made of other materials having a work function of larger than 4.5 eV depending upon the material of the emitting layer 16(26) to inject holes into the emitting layer 16(26) or the hole-transporting layer 15(25). For example, metal oxide such as IZO(IDIXO) or tin oxide (NESA), Au, Ag, Pt or Cu can be used.

Figure 3A:
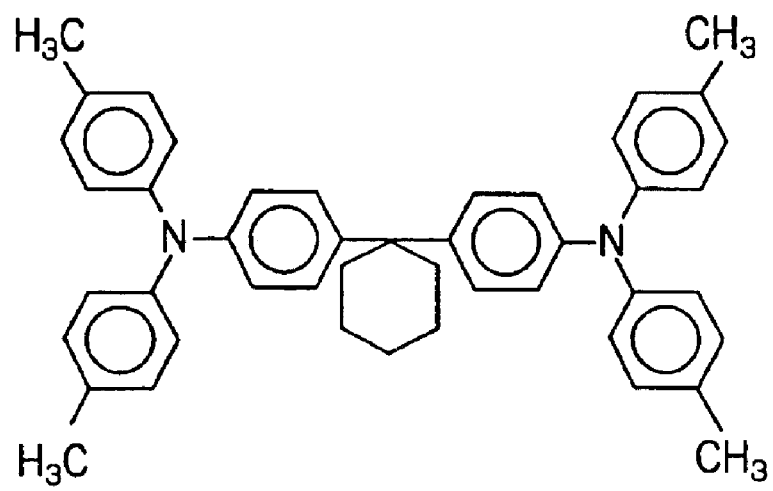
FIGS. 3A, 3B, 3C, 3D, 3E and 3F are diagrams showing chemical structures of material for the hole-transporting layer of FIGS. 1E and 2F.
Figure 3B:
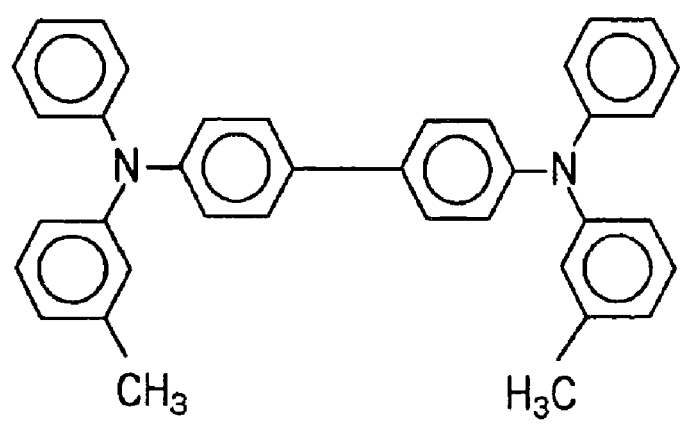
Figure 3C:
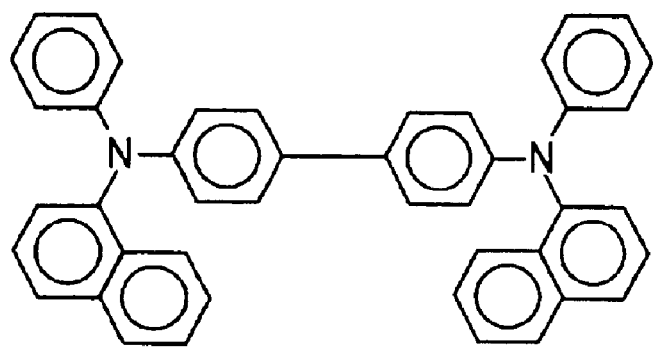
Figure 3D:
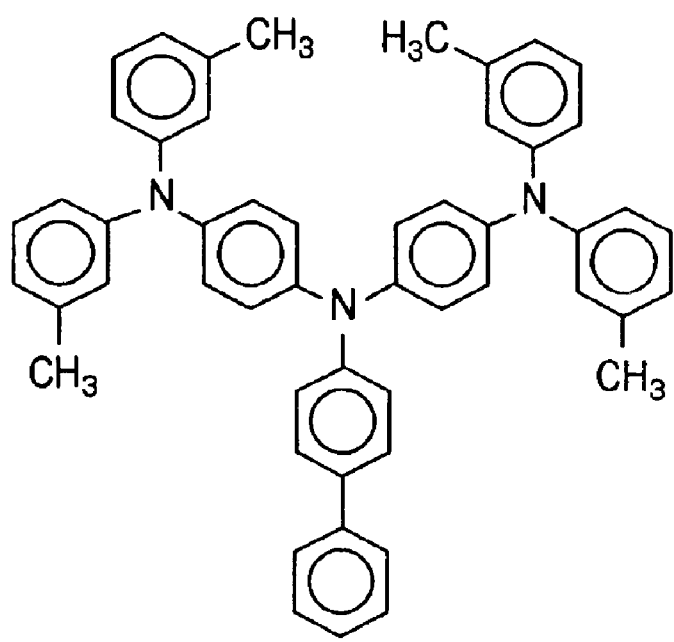
Figure 3E:
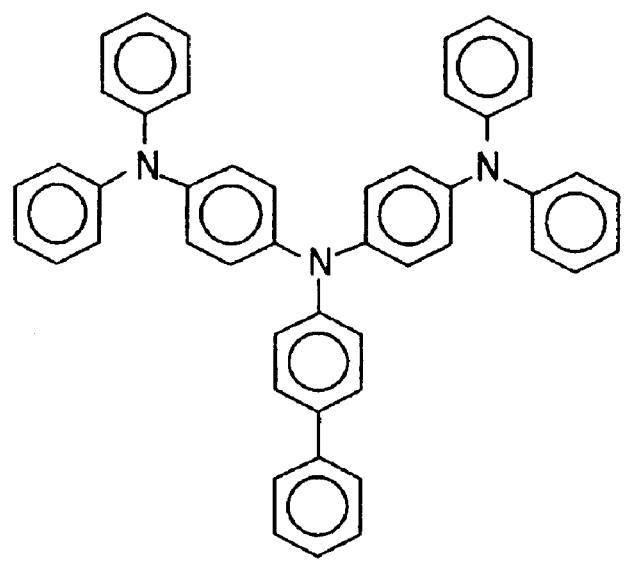
Figure 3F:
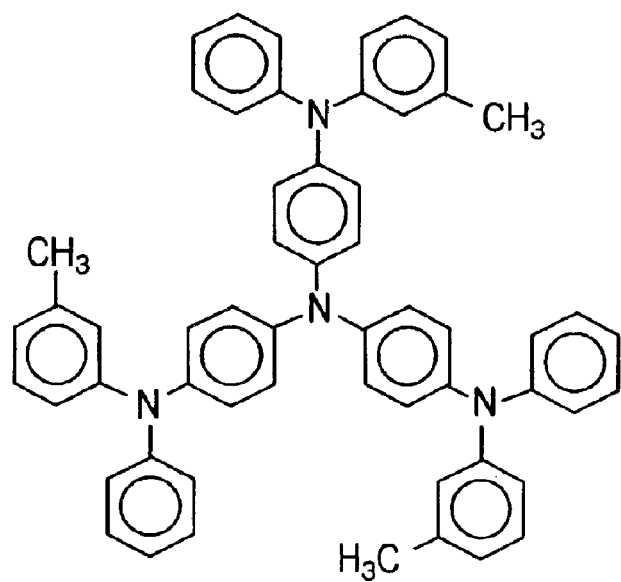

There is no particular limitation on a material for the hole-transporting layer 15(25). Any ordinary hole-transporting material may be used. For example, the hole-transporting layer 15(25) is made of a tripheny/diamine such as bis(di(p-tolyl) aminophenyl)-1,1-cyclohexane (see FIG. 3A), N,N'-diphenyl-N,N'-bis(3-methylphenyl)-1, 1'biphenyl-4,4'-diamine (see FIG. 3B) or N,N'-diphenyl-N, N'-bis(1-naphtyl)-1,1'-biphenyl)-4,4'-diamine (see FIG. 3C), star burst molecules (see FIGS. 3D, 3E and 3F), a poly (pphenylenevynylene) derivative, a polyaniline derivative or a polythiophene derivative. Also, the hole-transporting layer 15(25) is made of other conductive polymers. Further, the hole-transporting layer 15(25) is made of a mixture of a conductive polymer and Lewis acid such as $FeCl_3$.

There is no particular limitation on a material for the emitting layer 16(26). Any ordinary light-emitting material may be used. For example, the emitting layer 16(26) is made of a distyrylarylene derivative (see JP-A-2-247278 & JP-A-5-17765), a coumarin derivative, a dicyanomethylenephrane derivative, a perylene derivative (see JP-A-63-264692), an aromatic derivative (see JP-A-8-298186 & JP-A-9-268284), an anthracene compound (see JP-A-9-157643, JP-A-9-268283 & JP-A-10-72581), or a quinacridone derivative (see JP-A-5-70773).

Figure 4A:
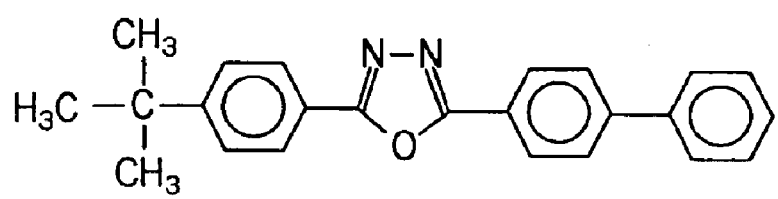
FIGS. 4A, 4B, 4C, 4D, 4E, 4F, 4G, 4H, 4I and 4J are diagrams showing chemical structures of material the electron-transporting layer of FIGS. 1E and 2F.
Figure 4B:
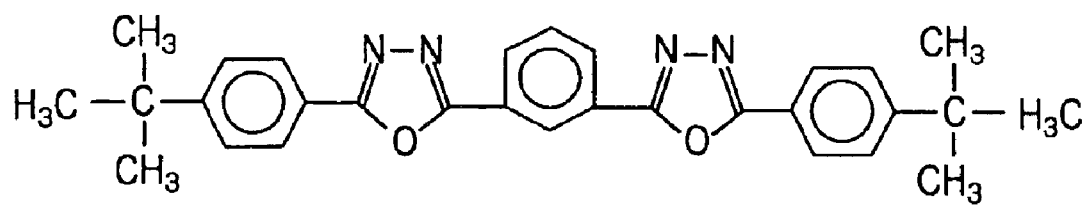
Figure 4C:
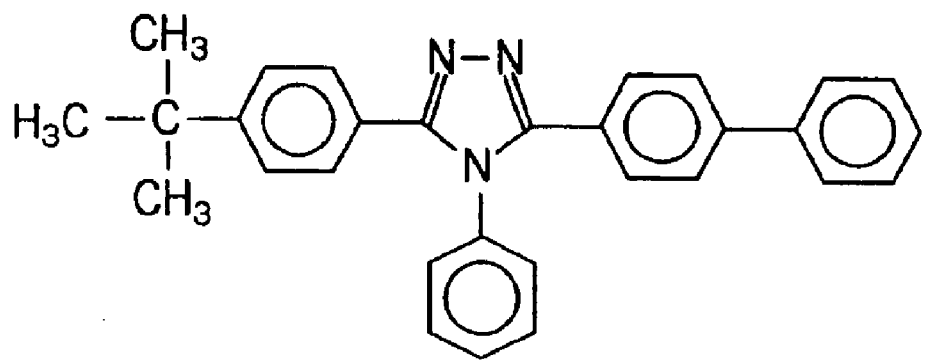
Figure 4D:
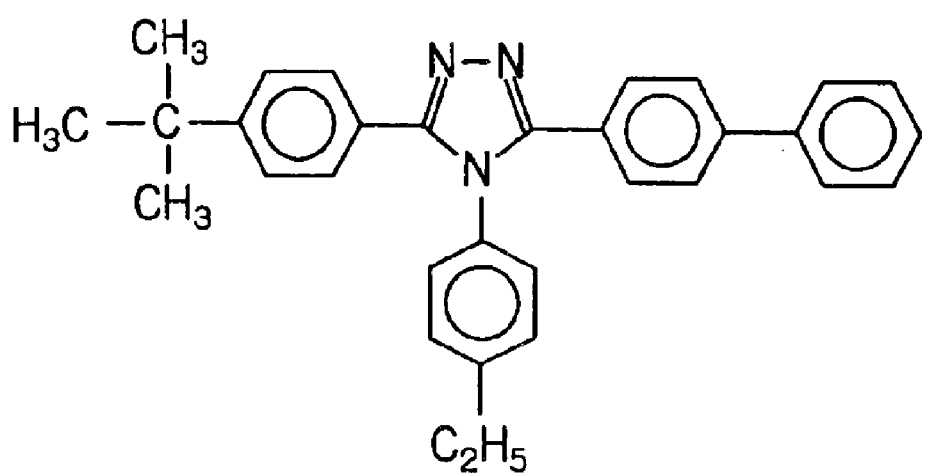
Figure 4E:
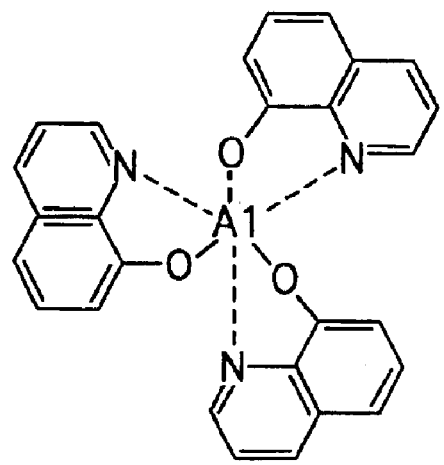
Figure 4F:
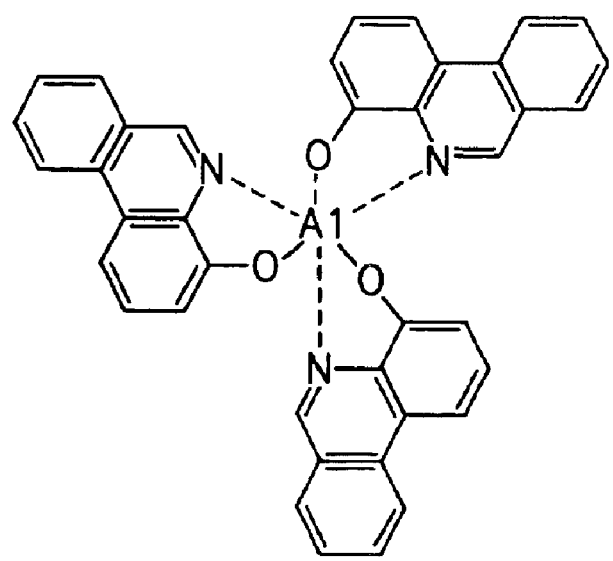
Figure 4G:
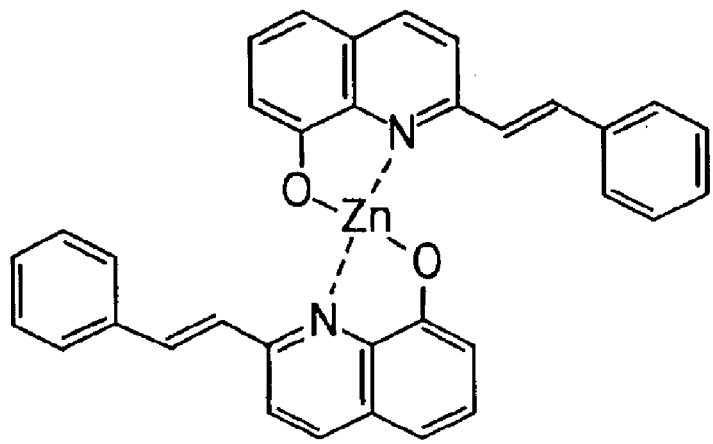
Figure 4H:
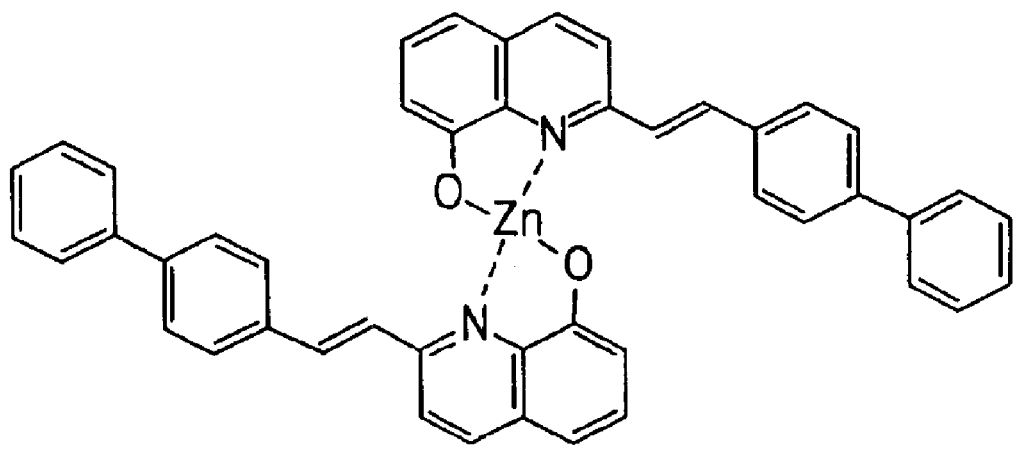
Figure 4I:
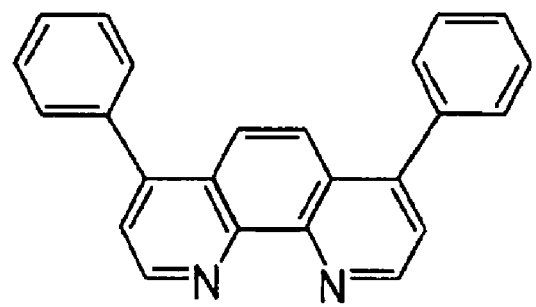
Figure 4J:
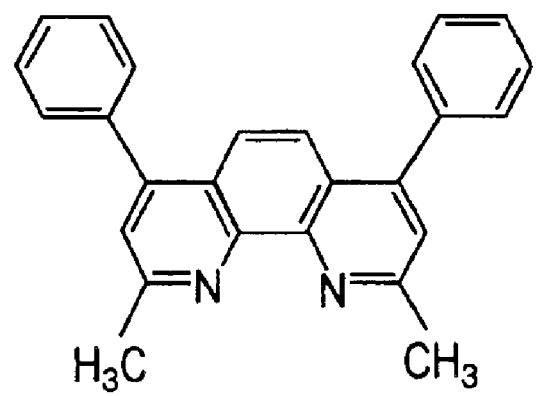

There is no particular limitation on a material for the electron-transporting layer 17(27). Any ordinary electron-transporting material may be used. For example, the electron-transporting layer 17(27) is made of an oxadiazole derivative such as 2(4-biphenyl)-5-(4-t-butyrphenyl)-1,3,4-oxadiazole derivative (see FIG. 4A) or bis {2-(4-t-butryphenyl)-1,3,4-oxadiazole}-m-phenylene (see FIG. 4B), a triazole derivative (see FIGS. 4C and 4D), a quinolinol metal complex (see FIGS. 4E, 4F, 4G and 4H), bathophenanthroline (see FIG. 4I), or bathocuprolene (see FIG. 4J).

The upper electrodes 18(28) is preferably made of conductive material having a small work function to inject electrons into the emitting layer 16(26) (or the electron-transporting layer 17(27)). For example, the upper electrodes 18(28) are made of In, Al, Mg, Mg—In alloy, Mg—Al alloy, Al—Li alloy, Al—Sc—Li alloy or Mg—Ag alloy. Note that, since the lower electrodes which, in this case, serve as anodes are transparent, the upper electrodes 18(28) serving as cathodes are preferably made of conductive material having a high reflectivity to reflect light emitted from the emitting layer 16(26).

In the above-described embodiments, the ITO layer 12(22) is formed by a sputtering process; however, the ITO layer 12(22) can be formed by a vacuum evaporation process, an ion-plating process, a chemical vapor deposition (CVD) process, a sol-gel coating process, a spray process or a spin-coating process.

Also, the organic layers such as the hole-transporting layer 15(25), the emitting layer 16(26) and the electron-transporting layer 17(27) are formed by a vacuum evaporation process; however, the organic layers can be formed by a molecular beam epitaxial (MBE) process, a dipping process, a coating process such as a spin-coating process, a casting process, a bar-coating process, or a roll-coating process using solutions of materials. In this case, the thickness of the organic layers can be optimized. That is, the thinner each of the organic layers, the larger the number of defects such as pinholes. On the other hand, the thicker each of the organic layers, the higher the voltage applied thereto for injecting carriers. In view of this, the thickness of each of the organic layers is preferably several nm to 1 μm.

Additionally, the upper electrodes 18(28) are formed by a vacuum evaporation process; however, the upper electrodes 18(28) can be formed by a magnetron sputtering process, an ion-plating process, a CVD process, a sol-gel coating process, a spray process or a spin-coating process.

In the above-described embodiments, other dry etching processes such as a plasma etching process can be used instead of the RIE process. Also, in the RIE process, various kind of gases can be used. For example, halogen gas such as $CF_4$ gas hydrocarbon gas such as $CH_4$ gas, inert gas such as Ar gas, or hydrogen gas can be used. Also, when depositing amorphous carbon, other carbon gas such as $CH_4$ gas can be used.

As explained hereinabove, according to the present invention, since the formation of lower electrodes and the formation of fillers between the lower electrodes are carried out in the same chamber, the manufacturing cost can be decreased.

What is claimed is:

1. A method for manufacturing an organic electroluminescent device, comprising the steps of:

forming a conductive layer on an insulating substrate;

forming a photoresist pattern layer having a plurality of striped elements a first direction on said conductive layer;

etching said conductive layer by a dry etching process using a first plasma gas and using said photoresist pattern layer as an etching mask in a chamber to form striped lower electrodes;

depositing an insulating layer on said photoresist pattern layer and on said insulating substrate between said lower electrodes by a plasma deposition process using a second plasma gas in said chamber;

performing a lift-off operation upon said photoresist pattern layer to remove said photoresist pattern layer and a part of said insulating layer on said photoresist pattern layer;

forming at least one organic thin film layer including an emitting layer on said insulating layer and said lower electrodes; and forming a plurality of striped upper electrodes on said organic thin film layer along a second direction different from said first direction.

2. The method as set forth in claim 1, wherein a condition for introducing said first plasma gas is the same as a condition for introducing said second plasma gas.

3. The method as set forth in claim 2, wherein each of said first and second plasma gas includes hydrocarbon gas.

4. The method as set forth in claim 1, wherein a condition for introducing said first plasma gas is different from a condition for introducing said second plasma gas.

5. The method as set forth in claim 4, wherein said first plasma gas includes halogen gas, and said second plasma gas includes hydrocarbon gas.

6. The method as set forth in claim 1, wherein said lower electrodes are anodes and said upper electrodes are cathodes.

7. The method as set forth in claim 6, further comprising a step of forming a hole-transporting layer between said lower electrodes and said emitting layer.

8. The method as set forth in claim 6, further comprising a step of forming an electron-transporting layer between said emitting layer and said upper electrodes.

9. The method as set forth in claim 1, wherein said insulating substrate is transparent and said lower electrodes comprise transparent conductive layers.

10. The method as set forth in claim 9, wherein said transparent conductive layers comprise indium tin oxide.

11. The method as set forth in claim 1, wherein said first direction is approximately normal to said second direction.

12. The method as set forth in claim 1, wherein said insulating layer comprises amorphous carbon.

13. A method for manufacturing an organic electroluminescent device, comprising the steps of:

forming a conductive layer on an insulating substrate;

forming a photoresist pattern layer having a plurality of striped elements alone a first direction on said conductive layer;

etching said conductive layer by a dry etching process using gas including hydrocarbon gas and using said photoresist pattern layer as an etching mask in a chamber to form striped lower electrodes, and subsequently depositing an insulating layer on said photoresist pattern layer and on said insulating substrate between said lower electrodes by a plasma deposition process using said gas including hydrocarbon gas in said chamber;

performing a lift-off operation upon said photoresist pattern layer to remove said photoresist pattern layer and a part of said insulating layer on said photoresist pattern layer, forming at least one organic thin film layer including an emitting layer on said insulating layer and said lower electrodes; and forming a plurality of striped upper electrodes on said organic thin film layer along a second direction different from said first direction.

14. A method for manufacturing an organic electroluminescent device, comprising the steps of:

forming a conductive layer on an insulating substrate;

forming a photoresist pattern layer having a plurality of striped elements along a first direction on said conductive layer;

etching said conductive layer by a dry etching process using a gas including halide gas and using said photoresist pattern layer as an etching mask in a chamber to form striped lower electrodes;

depositing an insulating layer on said photoresist pattern layer and on said insulating substrate between said lower electrodes by a plasma deposition process using a gas including hydrocarbon gas in said chamber;

performing a lift-off operation upon said photoresist pattern layer to remove said photoresist pattern layer and a part of said insulating layer on said photoresist pattern layer;

forming at least one organic thin film layer including an emitting layer on said insulating layer and said lower electrodes; and forming a plurality of striped upper electrodes on said organic thin film layer along a second direction different from said first direction.

* * * * *